(12) United States Patent
Lee

(10) Patent No.: US 7,795,528 B2
(45) Date of Patent: Sep. 14, 2010

(54) SOLAR ENERGY ASSEMBLY FOR PORTABLE ELECTRONIC DEVICE

(75) Inventor: Hsin-Ho Lee, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 1084 days.

(21) Appl. No.: 11/309,325

(22) Filed: Jul. 26, 2006

(65) Prior Publication Data
US 2007/0089776 A1   Apr. 26, 2007

(30) Foreign Application Priority Data
Oct. 26, 2005   (CN) .................. 2005 1 0100785

(51) Int. Cl.
*H01L 31/00* (2006.01)
*H04B 1/38* (2006.01)
(52) U.S. Cl. .................. 136/245; 136/246; 455/572; 455/573
(58) Field of Classification Search .............. 136/246, 136/245; 455/90, 572, 573
See application file for complete search history.

(56) References Cited

U.S. PATENT DOCUMENTS 3,627,585 A * 12/1971 Dollery et al. ............ 136/245
4,017,725 A * 4/1977 Roen ...................... 361/679.09
5,098,482 A * 3/1992 Warfield .................... 136/259
5,578,139 A * 11/1996 Jones et al. ................ 136/245
5,737,412 A * 4/1998 Yamashita ................. 379/446

FOREIGN PATENT DOCUMENTS

CN        2469828 Y      1/2002
CN        2514501 Y     10/2003

OTHER PUBLICATIONS

Entry for "resilient" from Webster's Third New International Dictionary, Unabridged. (1993).*

* cited by examiner

*Primary Examiner*—Jeffrey T Barton
(74) *Attorney, Agent, or Firm*—Jeffrey T. Knapp

(57) ABSTRACT

An exemplary solar energy assembly includes a body (10), a solar energy collecting component (20), and a lens module (30). The lens module is movably mounted to the body and is configured for concentrating incident solar radiation onto the solar energy collecting component. The solar energy collecting component is movably mounted to the body and is configured for converting incident solar radiation energy into electrical energy. The solar energy collecting component and the lens module are movable between a first position and a second position. In the first position the lens module, the body, and the solar energy collecting component are stacked on each other. In the second position the solar energy collecting component and the lens module are moved away from the body so as to enable the lens module to concentrate incident solar radiation onto the solar energy collecting component.

6 Claims, 2 Drawing Sheets

SOLAR ENERGY ASSEMBLY FOR PORTABLE ELECTRONIC DEVICE

FIELD OF THE INVENTION

The present invention generally relates to solar energy assemblies and, more particularly, to a solar energy assembly for portable electronic devices.

DESCRIPTION OF RELATED ART

With the development of wireless communication and information processing technologies, portable electronic devices such as mobile telephones and electronic notebooks are now in widespread use. These electronic devices enable consumers to enjoy high technology services anytime and anywhere.

Many portable electronic devices are equipped with rechargeable batteries. The batteries can be recharged through a power conversion adapter used in conjunction with household alternating current (AC) power or through a power conversion adapter used in conjunction with a 12-volt cigarette lighter socket provided in an automobile. However, when a user is away from such a power source, it is hard to recharge the battery.

It is well known that single crystal silicon photovoltaic cells, or silicon solar cells, have been successfully employed to convert incident solar radiation energy into electrical energy. The silicon solar cells are extensively used because they provide relatively high conversion efficiencies compared to other energy conversion devices that are presently available. However, the cost of the silicon solar cells has been a predominant system cost factor. Now it has been recognized that cost savings can be achieved by using concentrators or reflectors to increase the intensity of incident radiation, thus providing increased power outputs per unit solar cell area. However, when using a concentrator, there is generally a space between the concentrator and the silicon solar cell in order to achieve high intensity of the incident radiation. Correspondingly, the volume of the silicon solar cells system is large and awkward to carry.

Therefore, a new solar energy assembly for portable electronic devices is desired in order to overcome the above-described shortcomings.

SUMMARY OF THE INVENTION

In one embodiment thereof, a solar energy assembly is provided for an electronic device. The solar energy assembly includes a body, a solar energy collecting component, and a lens module. The solar energy collecting component and the lens module are mounted on the body. The lens module is configured for concentrating incident solar radiation onto the solar energy collecting component. The solar energy collecting component is configured for converting incident solar radiation energy into electrical energy. The solar energy collecting component and the lens module are movable between a first position and a second position. In the first position the lens module, the body, and the solar energy collecting component are stacked on each other. In the second position the solar energy collecting component and the lens module are moved away from the body so as to enable the lens module to concentrate incident solar radiation onto the solar energy collecting component.

Other advantages and novel features of the embodiments will become more apparent from the following detailed description thereof when taken in conjunction with the accompanying drawings.

BRIEF DESCRIPTION OF THE DRAWINGS

Many aspects of the present solar energy assembly can be better understood with reference to the following drawings. The components in the drawings are not necessarily drawn to scale, the emphasis instead being placed upon clearly illustrating the principles of the solar energy assembly and its potential applications. Moreover, in the drawings, like reference numerals designate corresponding parts throughout the several views.

DETAILED DESCRIPTION OF THE EMBODIMENTS

Figure 1:
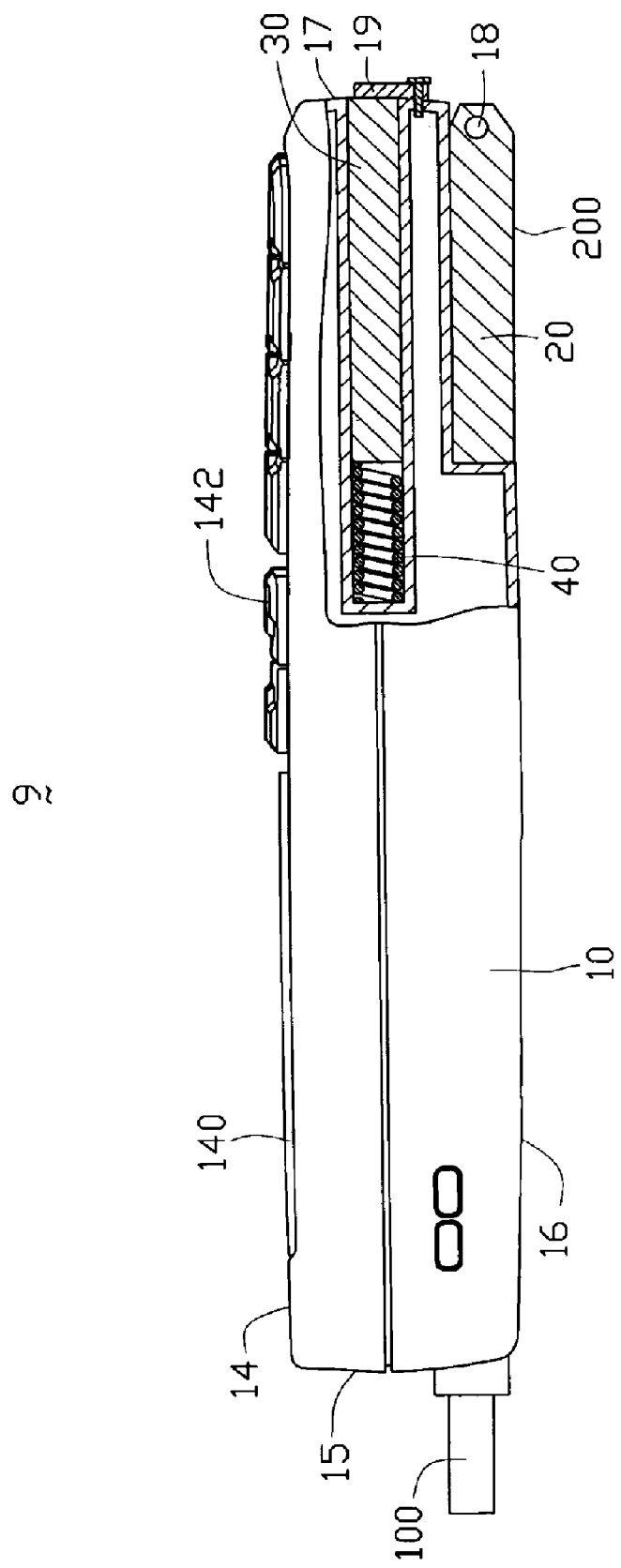
FIG. 1 is an assembled, partially cut-away view of a solar energy assembly used with a portable electronic device in a first position, in accordance with a preferred embodiment of the present invention.

Referring now to the drawings in detail, FIG. 1 shows a solar energy assembly used with a mobile phone 9. The mobile phone 9 is taken here as an exemplary application, for the purposes of describing details of the solar energy assembly of a preferred embodiment of the present invention. It is to be understood, however, that the solar energy assembly could be suitably used in other environments (e.g. in electronic notebooks or in water heaters). As such, although proving particularly advantageous when used in the mobile phone 9, the solar energy assembly should not be considered limited in scope solely to a single intended use environment.

The mobile phone 9 has a body 10. The body 10 is substantially cuboid shaped hand has a top wall 14, a bottom wall 16, a left sidewall 15, and a right sidewall 17. The top wall 14 is opposite to the bottom wall 16. The left sidewall 15 is opposite to the right sidewall 17. An antenna 100 is provided on the left sidewall 15. The antenna 100 is configured for sending or receiving electromagnetic signals for the mobile phone 9. A display assembly 140 is provided on the top wall 14. The display assembly 140 is configured for displaying information or graphics on a screen for a user. A keypad 142 is provided on the top wall 14 adjacent to the display assembly 140. The keypad 142 includes a plurality of separate grids of numerical and function keys for information input.

Figure 2:
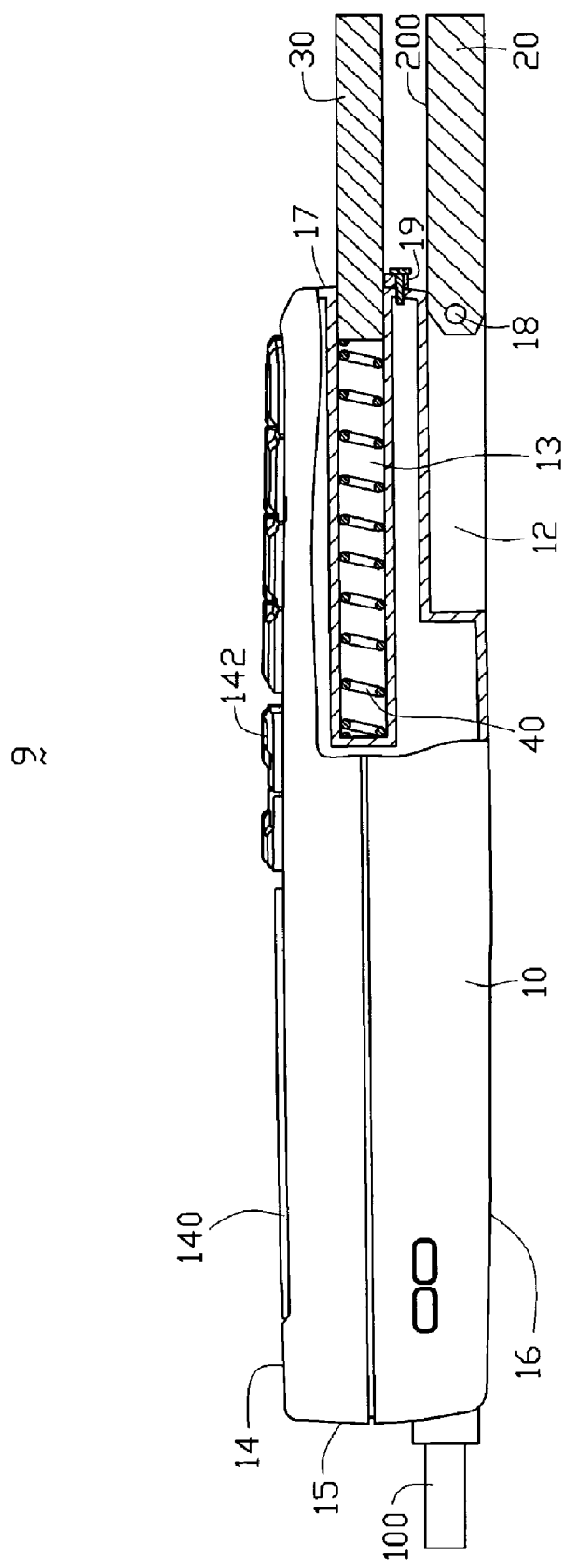
FIG. 2 is similar to FIG. 1 but showing the solar energy assembly in a second position.

Also referring to FIG. 2, the body 10 defines a first receiving cavity 12 in an intersection of the bottom wall 16 and the right sidewall 17. The body 10 defines a second receiving cavity 13 in the right sidewall 17. The depth of the second receiving cavity 13 is larger than that of the first receiving cavity 12. A shaft 18 is formed on an inner wall of the body 10 in the first receiving cavity 12. A latching board 19 is rotatably mounted on the left sidewall 17 adjacent to one end of the second receiving cavity 13. It is to be understood that the latching board 19 may be mounted to the body 10 with a bolt.

The solar energy assembly includes a solar energy collecting component 20, a lens module 30, and a resilient member 40. The solar energy collecting component 20 is for converting incident solar radiation energy into electrical energy. The solar energy collecting component 20 is substantially in the form of a cuboid and is configured for being received in the first receiving cavity 12 of the body 10. The solar energy collecting component 20 has an energy collecting surface 200. A plurality of silicon solar cells are provided at the energy collecting surface 200 for collecting incident solar radiation energy and converting incident solar radiation energy into electrical energy. One end of the solar energy collecting component 20 defines a hole configured for engaging with the shaft 18 of the body thereby rotatably mounting the solar energy collecting component 20 to the body 10.

The lens module 30 is substantially cuboid shaped and is configured for being received in the second receiving cavity 13 of the body 10. The lens module 30 is configured for concentrating incident solar radiation onto the silicon solar cells of the solar energy collecting component 20. In the present embodiment, the lens module 30 is a Fresnel lens module. The area of the lens module 30 is substantially equal to the area of the solar energy collecting component 20.

The resilient member 40 is a compression spring in the present embodiment. The resilient member 40 is preferably made of metal and is spiral in shape (i.e. a coiled spring). The resilient member 40 is configured for being received in the second receiving cavity 13 of the body 10. The length of the resilient member 40 in an original state is smaller than the depth of the second receiving cavity 13. It is to be understood that the resilient member 40 may be configured in another shape such as a leaf spring or a cylindrical rubber. The resilient member 40 may be made of another resilient material such as plastic or rubber.

In assembly, the solar energy collecting component 20 is mounted in the first receiving cavity 12 of the body 10 by the shaft 18 of the body 10 engaging in the hole of the solar energy collecting component 20. The energy collecting surface 200 faces towards a same direction in which the bottom wall 16 faces. The resilient member 40 and the lens module 30 are received in the second receiving cavity 13 of the body 10. The lens module 30 is fully received in the second receiving cavity 13 by the latching board 19. One end of the resilient member 40 is secured on an inner wall of the body 10 in the second receiving cavity 13. Thus the mobile phone 9 is assembled with the solar energy assembly. Now the solar energy assembly is in a first position and the resilient member 40 is compressed.

Further referring to FIG. 2, when the mobile phone 9 is in use for charging, the latching board 19 is manually moved away from the lens module 30. The lens module 30 is moved to slide out of the second receiving cavity 13 due to the decompressed resilient member 40. Because the length of the resilient member 40 in an original state is smaller than the depth of the second receiving cavity 13, an inner end of the lens module 30 is still received in the second receiving cavity 13. The solar energy collecting component 20 is manually rotated out of the first receiving cavity 12 about an axis of the shaft 18 in an anti-clockwise direction, until the solar energy collecting component 20 is substantially parallel to the lens module 30. Now the energy collecting surface 200 faces toward the lens module 30. The solar energy assembly is in a second position. The body 10 and the solar energy assembly are configured for enabling the energy collecting surface 200 of the solar energy collecting component 20 to be positioned at a focal distance of the lens module 30 in order to increase the intensity of incident radiation. A battery in the mobile phone 9 is recharged through the solar energy assembly.

Further referring to FIG. 1, when the solar energy assembly is not in use the lens module 30 is pressed into the second receiving cavity 13. In this process, the resilient member 40 is compressed until the lens module 30 is fully received in the second receiving cavity 13 by the latching board 19. The solar energy collecting component 20 is rotated about the axis of the shaft 18 in a clockwise direction, until the solar energy collecting component 20 is fully received in the first receiving cavity 12. Now the solar energy assembly is in the first position. The volume of the solar energy assembly in the first position is much smaller than that in the second position thus making the solar energy assembly convenient to carry.

It is to be understood that the solar energy collecting component 20 may be slidably received in the second receiving cavity 13 and the lens module 30 may be received in the first receiving cavity 12.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A portable electronic device comprising:
    a device body defining a first receiving cavity and a second receiving cavity, the first receiving cavity communicating with one side of the device body; and
    a solar energy assembly movably mounted to the body; comprising:
        a solar energy collecting component for converting incident solar radiation energy into electrical energy, the solar energy collecting component rotatably mounted to the device body and having a first position received in the first receiving cavity and flush with the side of the device body; and
        a lens module for concentrating incident solar radiation onto the solar energy collecting component, the lens module slidably mounted to the device body and having a first position received in the second receiving cavity;
    wherein when the solar energy collecting component is rotated out of its first position within the first receiving cavity, and the lens module is slid out of its first position within the second receiving cavity, the lens module is parallel to the solar energy collecting component and the lens module concentrates incident solar radiation onto the solar energy collecting component.

2. The portable electronic device as claimed in claim 1, further comprising a compression spring, wherein the compression spring is received in the second receiving cavity, the lens module is resiliently mounted to the body by the compression spring, a length of the compression spring in an original state is smaller than a depth of the second receiving cavity to allow an inner end of the lens module is always in the second receiving cavity.

3. The portable electronic device as claimed in claim 2, wherein a latching board is rotatably mounted to the body adjacent to the second receiving cavity configured for positioning or releasing the lens module relative to the body.

4. The portable electronic device as claimed in claim 1, wherein the body has a shaft, the solar energy collecting component is rotated to 180 degrees around the shaft.

5. The portable electronic device as claimed in claim 1, wherein the first receiving cavity is parallel to the second cavity.

6. The portable electronic device as claimed in claim 1, wherein the lens module is a Fresnel lens module.

* * * * *